US012660670B2

(12) United States Patent　　(10) Patent No.:　US 12,660,670 B2
Chiang et al.　　　　　　　　　(45) Date of Patent:　　　Jun. 16, 2026

(54) INTEGRATED CIRCUIT DEVICE WITH EMBEDDED METAL PADS

(71) Applicant: Micron Technology, Inc., Boise, ID (US)

(72) Inventors: Tsung Han Chiang, Taichung (TW); Shin Yueh Yang, Taichung (TW)

(73) Assignee: Micron Technology, Inc., Boise, ID (US)

( * ) Notice:　Subject to any disclaimer, the term of this patent is extended or adjusted under 35 U.S.C. 154(b) by 674 days.

(21) Appl. No.: 17/943,580

(22) Filed:　　Sep. 13, 2022

(65)　　　　Prior Publication Data

US 2024/0088072 A1　　Mar. 14, 2024

(51) Int. Cl.
　H01L 23/00　　　(2006.01)
　H10W 72/00　　　(2026.01)
　H10W 72/20　　　(2026.01)
　H10W 72/90　　　(2026.01)
(52) U.S. Cl.
　CPC ......... H10W 72/90 (2026.01); H10W 72/012 (2026.01); H10W 72/20 (2026.01); H10W 72/01235 (2026.01); H10W 72/01251 (2026.01); H10W 72/01257 (2026.01); H10W 72/221 (2026.01); H10W 72/223 (2026.01); H10W 72/234 (2026.01); H10W 72/252 (2026.01); H10W 72/255 (2026.01); H10W 72/921 (2026.01); H10W 72/9415 (2026.01); H10W 72/952 (2026.01)
(58) Field of Classification Search
　CPC .. H10D 84/856; H10D 64/017; H10D 62/221; H10D 62/151; H10D 62/119; H10D 84/017; H10D 84/038
　See application file for complete search history.

(56)　　　　References Cited

U.S. PATENT DOCUMENTS

| | | | |
|---|---|---|---|
| 4,654,787 A | 3/1987 | Finnel et al. | |
| 5,907,512 A | 5/1999 | Parkinson et al. | |
| 6,026,465 A | 2/2000 | Mills et al. | |
| 7,149,865 B2 | 12/2006 | Chamberlain et al. | |
| 9,391,036 B2 * | 7/2016 | Matsumoto ............. | H01L 24/13 |
| 2001/0040290 A1 * | 11/2001 | Sakurai ................... | H01L 24/13 |
| | | | 257/737 |
| 2010/0109158 A1 * | 5/2010 | Platz ...................... | H01L 23/522 |
| | | | 257/737 |
| 2010/0164098 A1 * | 7/2010 | Kuechenmeister ..... | H01L 24/11 |
| | | | 257/E23.06 |
| 2010/0219527 A1 * | 9/2010 | Feustel ................... | H01L 24/03 |
| | | | 257/737 |
| 2013/0062764 A1 * | 3/2013 | Jin ....................... | H01L 23/3114 |
| | | | 257/737 |
| 2017/0141023 A1 * | 5/2017 | Arisaka ............. | H01L 23/49811 |
| 2020/0035631 A1 * | 1/2020 | Chang .................... | H01L 24/06 |

* cited by examiner

*Primary Examiner* — Eliseo Ramos Feliciano
*Assistant Examiner* — Timothy Edward Duren
(74) *Attorney, Agent, or Firm* — Brooks, Cameron & Huebsch, PLLC

(57)　　　　　　ABSTRACT

Methods, apparatuses, and systems related to embedded metal pads are described. An example semiconductor device includes a dielectric material, a metal pad having side surface, where a lower portion of the side surface is embedded in the dielectric material, a mask material on a portion of a surface of the dielectric material, an upper portion of the side surface of the metal pad, and a portion of a top surface of the metal pad and a contact pillar on a second portion of the top surface of metal pad, the contact pillar comprising a metal pillar and a pillar bump.

20 Claims, 7 Drawing Sheets

250

251 — FORM A SEMICONDUCTOR SUBSTRATE INCLUDING STACKED MATERIALS WITH EMBEDDED METAL PAD

252 — FORM AN OPENING IN AT LEAST ONE MATERIAL IN THE STACKED PLURALITY OF MATERIALS

253 — FORM A CONTACT PILLAR IN THE OPENING

355

356 — FORM A PLURALITY OF STACKED MATERIALS INCLUDING AN EMBEDDED METAL PAD

357 — FORM AN OPENING IN AT LEAST ONE MATERIAL IN THE STACKED PLURALITY OF MATERIALS

358 — DEPOSIT A CONTACT PILLAR MATERIAL TO FORM A METAL PILLAR

359 — DEPOSIT A PILLAR BUMP ON THE METAL PILLAR

360 — REMOVE A PORTION OF A MASK MATERIAL

INTEGRATED CIRCUIT DEVICE WITH EMBEDDED METAL PADS

TECHNICAL FIELD

The disclosure relates generally to semiconductor devices, apparatuses, and methods, and more particularly to embedded metal pads. Semiconductor devices can be used in a variety of electronic applications, such as personal computers, cell phones, digital cameras, and other electronic devices.

BACKGROUND

Various semiconductor devices (e.g., memory dies) utilize through-substrate- vias (TSVs) which are conductive vias that can provide electrical continuity through a semiconductor device, such as a silicon wafer or die, for instance. TSVs can enable two or more semiconductor devices (e.g., integrated circuit (IC) devices) to be stacked vertically into a three-dimensional (3D) chip/wafer stack. For example, the TSVs of an IC device at a top of a stack can connect to the TSVs of an IC device lower in the stack. By electrically connecting the IC devices in a stack, the TSVs can enable the IC devices in the stack to function as a single device. TSV technology can enable a 3D chip stack to have increased connectivity, bandwidth, and/or functionality, yet occupy a small footprint area, among other benefits.

DETAILED DESCRIPTION

Figures 1A, 1B:
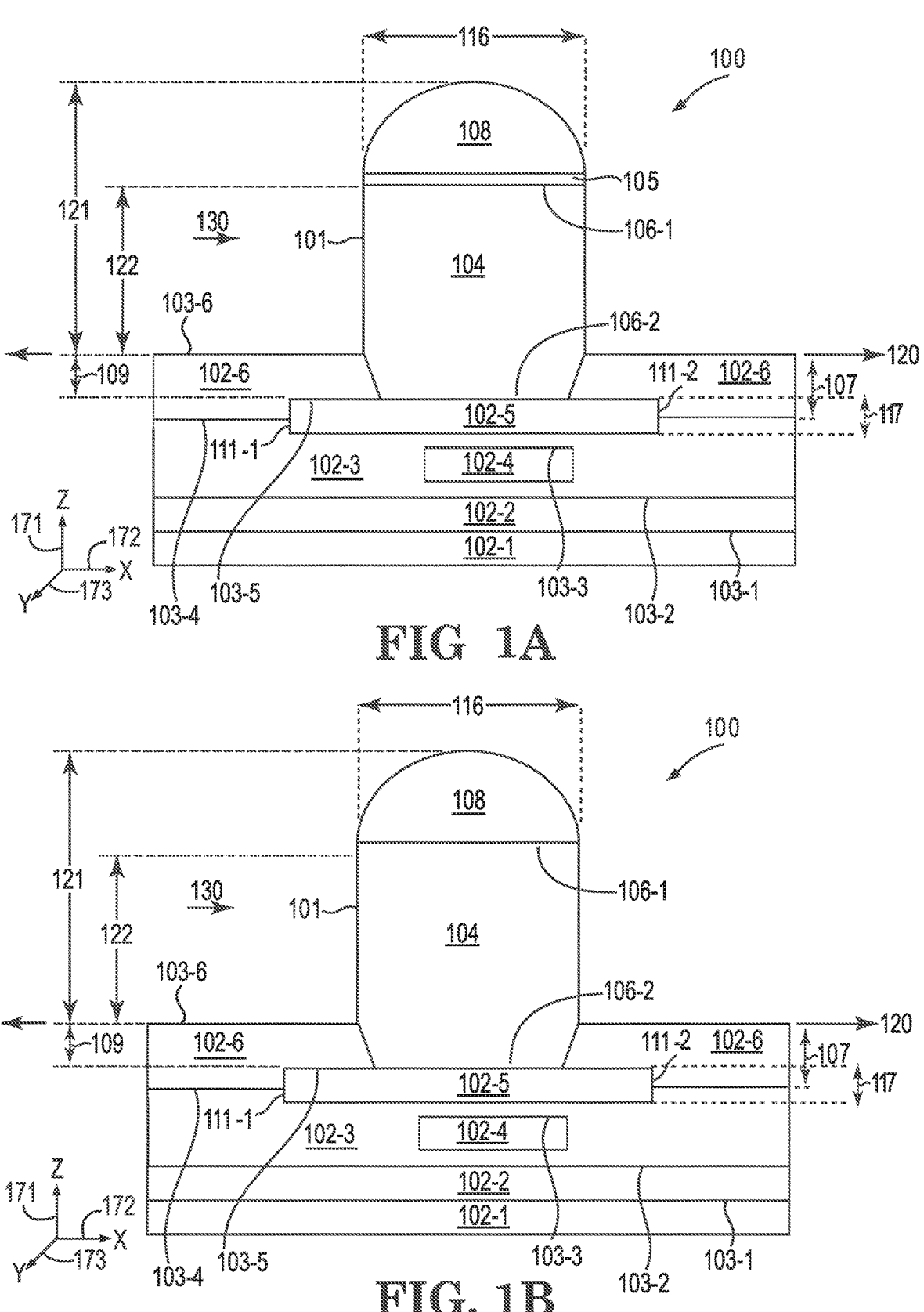
FIG. 1A illustrates a view of a cross-section of an example of a semiconductor device with an embedded metal pad in accordance with a number of embodiments of the disclosure.
FIG. 1B illustrates a view of a cross-section of another example of a semiconductor device with an embedded metal pad in accordance with a number of embodiments of the disclosure.

Semiconductor devices can include access devices, such as transistors, and storage nodes, such as capacitors, in an example memory array. A dynamic random access memory (DRAM) array is one example memory array that can be formed from semiconductor devices, as discussed herein. The memory array may have a number of access devices and storage nodes forming memory cells at the intersection of rows and columns. An access line (e.g., word line (WL)), may be used to activate an access device (e.g., a transistor), to access (e.g., turn "on" or "off" access to) the storage node of a memory cell. A sense line (e.g., bit line (BL) or digit line (DL)) may be used to read and/or program (e.g., write, refresh, erase, etc. to and/or from a storage node of the memory cells).

Wafer and/or chip bonding can be used to form vertical stacks of semiconductor devices. Wafer and/or chip bonding can effectively and efficiently form a single packaged semiconductor system that includes two or more wafer and/or chip layers. For example, contact pillars (e.g., copper contact pillars) can be formed on and/or in underlying materials, such as a semiconductor substrate. For instance, the contact pillar can be configured in a direction that is substantially normal to the semiconductor substrate or other underlying materials.

Solder, also known as pillar bumps, can be located on ends of the contact pillars. During the wafer and/or chip bonding, the pillar bumps can be positioned near or in contact an adjacent semiconductor structure. For instance, the pillar bumps can be positioned in contact with landing pads on an adjacent semiconductor structure. Heat can be applied to cause the solder to reflow and thereby form a bond (e.g., an electrical interconnection) between the contact pillars and the adjacent structures (e.g., the landing pads). The resultant bonds can electrically couple the semiconductor device to an adjacent semiconductor structure (e.g., another semiconductor device) and thereby form a single packaged semiconductor system.

Yet, wafer and/or chip bonding poses challenges, particularly as design rules scale to smaller dimensions. For instance, wafer and/or chip bonding may predicated on having underlying materials remain in physical contact (e.g., having an absence of voids between adjacent surfaces of the underlying materials). However, wafer and/or chip bonding may subject the contact pillars and thereby underlying materials to various forces. For example, a lateral force can be imparted on a side surface of the contact pillar and this lateral force may be translated from the contact pillar to the underlying materials. Thus, responsive to the lateral force, the underlying materials may delaminate (e.g., voids may form between surfaces of the underlying materials). For instance, an interface between the metal pad and the dielectric material may be prone to experiencing delamination and/or void formation responsive to application of a lateral force to a contact pillar. Delamination and/or void formation in the underlying materials may contribute to unintended consequences related to the electrical properties of a semiconductor device (e.g., memory device), which may adversely affect performance related to data access, storage, and/or processing functions of the semiconductor device, for instance.

This disclosure includes methods, apparatuses, and systems related to semiconductor devices with embedded metal pads. An example of an apparatus with an embedded metal pad includes a dielectric material, a metal pad having side surface, where a lower portion of the side surface is embedded in the dielectric material, a mask material on a portion of a surface of the dielectric material, an upper portion of the side surface of the metal pad, and a portion of a top surface of the metal pad and a contact pillar on a second portion of the top surface of metal pad, the contact pillar comprising a metal pillar and a pillar bump.

As described herein, the apparatus and systems with embedded metal pads may be less prone to exhibiting processing defects such as delamination and/or void formation, as compared to other structures which do not have embedded metal pads. For instance, an interface between the embedded metal pad and the dielectric material may be less prone to experiencing delamination and/or void formation due at least in part to having a lower portion of the side surface of the embedded metal pad being embedded in the dielectric material, as detailed herein.

Moreover, the structures with embedded metal pads discussed herein can exhibit enhanced bonding (e.g., complete bond formation) and/or enhanced electrical connection, as compared to other approaches. Examples of other approaches include those that employ planar contact pillars (having a top surface of the contact pillar that is planar with a top surface of an adjacent material) and/or that do not use solder to form electrical connections.

In the following detailed description of the disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the disclosure. As used herein, "a number of" something can refer to one or more such things. For example, a number of capacitors can refer to at least one capacitor.

Relative terms such as "under," "below," "underneath," "over," "on," "above," "bottom," "side," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," "underlaying" or "underneath" can encompass both orientations of the device. Because devices or components of embodiments of the disclosure can be positioned in a number of different orientations (e.g., rotated 90 degrees, 180 degrees, or at another orientations), the relative terms should be interpreted accordingly.

The figures herein follow a numbering convention in which the first digit or digits correspond to the figure number of the drawing and the remaining digits identify an element or component in the drawing. Similar elements or components between different figures may be identified by the use of similar digits. For example, reference numeral 101 may reference element "01" in FIG. 1A, and a similar element may be referenced as 101 in FIG. 1B.

FIG. 1A illustrates a view of a cross-section of an example of a semiconductor device 100 with an embedded metal pad in accordance with a number of embodiments of the disclosure. The semiconductor device 100 can be a semiconductor wafer (wafer) or a semiconductor chip (chip).

The semiconductor device 100 can be bonded to another semiconductor device (e.g., another wafer or chip) and/or can be bonded to another type of structure. For instance, a plurality of semiconductor devices can be bonded together via the contact pillars to form various types of memory (e.g., DRAM), storage (e.g., NAND), and/or hybrid memory (e.g., a combination of DRAM and logic) and/or various types of integrated circuits such as CMOS integrated circuits.

In some embodiments, a first semiconductor device (e.g., a front-end wafer including active transistors) can be bonded to a second semiconductor device (e.g., a back-end wafer which has relatively fewer or an absence of any active transistors). The first semiconductor device and/or the second semiconductor device can include embedded metal pillars, as described herein. In such embodiments, the first semiconductor device and the second semiconductor device can be processed in parallel, thus saving cycle time. The semiconductor devices can be bonded together to form a system including the semiconductor devices. The system including the semiconductor devices can be employed in various types of memory.

Various types of bonding can be employed. Bonding can include a heat treatment and/or application of heat to at least a portion of a semiconductor device. For instance, solder, such as utilized for the contact pillars as described herein, can be heated to reflow and subsequently cooled to form bonds. In some embodiments, a portion of the back-end substrate can be removed by grinding, chemical-mechanical-processing (CMP) or etch processes, leaving the metal layers bonded to the front-end substrate.

As illustrated in FIG. 1A, the semiconductor device 100 can include a semiconductor substrate 102-1 (e.g., substrate). The semiconductor substrate 102-1 may be formed from various undoped or doped materials on which various other materials may be deposited, masked, etched, etc., to form semiconductor devices. Examples of a suitable semiconductor substrate materials include a relatively inert substrate material. The relatively inert semiconductor substrate material may include monocrystalline silicon, polycrystalline silicon (polysilicon), and/or amorphous silicon, among other possibilities.

The semiconductor device 100 can include various dielectric materials. As used herein, the term "dielectric material" refers to and includes electrically insulative materials. Dielectric materials, as discussed herein, may include, but is not limited to, one or more of an insulative oxide material or an insulative nitride material. A dielectric oxide may be an oxide material, a metal oxide material, or a combination thereof. The dielectric material may include, but is not limited to, silicon oxide ($SiO_x$), doped $SiO_x$, phosphosilicate glass, borosilicate glass, borophosphosilicate glass, fluorosilicate glass, tetraethylorthosilicate (TEOS), aluminum oxide ($AlO_x$), silica carbon nitride (SiCN), silicon oxynitride (SiON), gadolinium oxide (GdOx), hafnium oxide (HfOx), magnesium oxide (MgOx), niobium oxide (NbOx), tantalum oxide (TaOx), titanium oxide (TiOx), zirconium oxide carboxynitride (e.g., SiOxCzNy), a combination thereof or a combination of one or more of the listed materials with silicon oxide. One or more embodiments provide that the dielectric material comprises a vertical stack formed of a plurality of stacked layers of different dielectric materials, such as layers of different oxide materials.

For instance, the semiconductor device 100 can include a low-k dielectric material 102-2. The low-k dielectric material can have a lower dielectric constant (low-k) than other dielectric materials included in the semiconductor device 100. As an example, the low-k dielectric material can be formed of silicon oxide (SiOx), such as silicon dioxide ($SiO_2$), among other possibilities. In some embodiments, the low-k dielectric material can be disposed on a surface of the semiconductor substrate 102-1. For instance, as illustrated in FIG. 1A and FIG. 1B, the low-k dielectric material can be disposed on a top surface 103-1 of the semiconductor substrate 102-1. For example, the low-k dielectric material can be disposed on and overlay (e.g., be in direct physical contact) with some or all of the top surface 103-1 of the semiconductor substrate 102-1.

The semiconductor device 100 can include a dielectric material 102-3. As an example, the dielectric material 102-3 can be formed of an insulative oxide material or an insulative nitride material. In some embodiments, the dielectric material 102-3 be an insulative oxide material. As illustrated in FIG. 1A and FIG. 1B, the dielectric material 102-3 can be disposed on a top surface 103-2 of the low-k dielectric material 102-2. For example, the dielectric material 102-3 can be disposed on and overlay (e.g., be in direct physical contact) with some or all of the top surface 103-2 of the low-k dielectric material 102-2. While illustrated as a continuous layer of an individual dielectric material, in some embodiments, the dielectric material can be formed of a plurality of layers and/or a plurality of different types of dielectric materials.

The semiconductor device 100 can include a conductive material 102-4. As used herein, the term "conductive material" refers to and includes electrically conductive materials. Embodiments provide that the conductive material can be a metal. The conductive material can include a metal (e.g., tungsten (W), copper (Cu), aluminum (Al), titanium (Ti), tantalum (Ta), ruthenium (Ru), cobalt (Co), molybdenum (Mo), etc.), a conductive metal nitride (e.g., titanium nitride, tantalum nitride, etc.), and/or a metal-semiconductor compound (e.g., tungsten silicide, cobalt silicide, titanium silicide, etc.), among other materials. One or more embodiments provide that the conductive material 102-4 comprises aluminum.

The conductive material 102-4 can be in contact with a surface of the dielectric material 102-3. For example, an opening can be formed in a portion of the dielectric material 102-3. The conductive material 102-4 can subsequently be disposed in the opening. The dielectric material 102-3 can be disposed on at least a top surface of the conductive material 102-4 such that the conductive material is disposed in the dielectric material 102-3. For instance, as illustrated in FIG. 1A and FIG. 1B, the dielectric material 102-3 can be disposed on surfaces of the conductive material 102-4. For example, the dielectric material can be disposed on and overlay (e.g., be in direct physical contact) with some or all of the top surface 103-3 of the conductive material 102-4.

The semiconductor device 100 can include an embedded metal pad 102-5. The metal pad can be formed a conductive material that is the same as or different than the conductive material 102-4. One or more embodiments provide that the embedded metal pad 102-5 comprises aluminum.

The embedded metal pad 102-5 can be disposed on a portion of a surface of the dielectric material 102-3. For instance, as illustrated in FIG. 1A and FIG. 1B, the metal pad can be disposed on a recess located in the top surface of the dielectric material 102-3. The recess can be formed by masking and etching a portion of the top surface of the dielectric material.

As such, a lower portion 111-1 of a side surface of the embedded metal pad 102-5 can be embedded a distance in the dielectric materials. Accordingly, the embedded metal pad 102-5 can be more resistant to delamination and/or void formation that other approaches such as those which dispose the entire metal pad on a planar top surface of a dielectric material rather than in a recess in the dielectric material.

The lower portion 111-1 of the side surface embedded in the dielectric material 102-3 has a height that is at least 5 percent of a total height 117 of the side surface. The height extends in a vertical ("Z") direction 171 (e.g., perpendicular or normal to a first horizontal ("X") direction 172 and a second horizontal ("Y") direction 173 plane). In some embodiments, wherein the lower portion 111-1 of the side surface is embedded in the dielectric material has a height that is in a range from 5 percent to 90 percent of a total height 117 of the side surface. All individual values and subranges from 5 to 90 percent are included; for example, the lower portion 111-1 can have a height from a lower limit of 5, 10, 15, 20, 30, or 40 percent to an upper limit of 90, 80, 70, or 50 percent. For instance, having the height of the lower portion 111-1 is about 50 percent of the height 117 or about 40 percent of the height 117, among other possibilities.

The semiconductor device 100 can include a mask material 102-6. In some embodiments, the mask material 102-6 can be a polymer. For instance, the mask material can be a polyamide, among other possibilities. However, in some embodiments, the mask material 102-6 may be a monocrystalline silicon (monosilicon), polycrystalline silicon (polysilicon), and amorphous silicon, among other possibilities.

The mask material 102-6 can be a top material in stack of a plurality of materials. For instance, the mask material 102-6 can be disposed a portion of the embedded metal pad 102-5 and/or a portion of the dielectric material 102-3. For instance, the mask material can be disposed on a portion of a top surface of the dielectric material 103-4, the upper portion 112-1 of the embedded metal pad, and a portion of a top surface 103-5 of the embedded metal pad 102-5, as illustrated in FIG. 1A and FIG. 1B. Accordingly, the mask material 102-6 can contact the upper portion 111-2 of the side surface of the embedded metal pad 102-5 and a portion of the top surface 103-5 of the embedded metal pad, as illustrated in FIG. 1A and FIG. 1B.

The mask material 102-6 can have a given thickness 107. The thickness 107 extends in a vertical ("Z") direction 171 (e.g., perpendicular or normal to a first horizontal ("X") direction 172 and a second horizontal ("Y") direction 173 plane). The vertical ("Z") direction 171 may extend (e.g., vertically) from a surface (e.g., extending vertically in a direction orthogonal to the top surface 103-1 the semiconductor substrate 102-1, as illustrated in FIG. 1A) of the substrate discussed herein.

For instance, the mask material 102-6, can have a thickness 107 of at least 5 nanometers, at least 10 nanometers, or at least 15 nanometers. For instance, in some embodiments, the thickness 107 can be in a range from 5 nanometers to 60 nanometers. All individual values and subranges from 5 to 60 nanometers are included; for example, mask material can have a thickness from a lower limit of 5, 6, 7, 8, 9, 10, 11, 12, 13, 14, or 15 nanometers to an upper limit of 60 50, 40, 30, or 20, nanometers. For instance, having the thickness 107 of the mask material 102-6 in a range from 5 nanometers to 60 nanometers can permit the embedded metal pad to be partially embedded a distance into the mask material, as described herein.

The semiconductor device 100 can include a contact pillar 101. The contact pillar 101 can include a contact pillar 104 and a pillar bump 108. In some embodiments, the contact pillar can include a barrier material, as described herein.

The metal pillar 104 can be formed with a contact pillar material, such as a conductive material. One or more embodiments provide that the conductive material comprises copper. Stated differently, in some embodiments the contact pillar material can be copper and the metal pillar 104 is a copper pillar. For instance, in some embodiments, the metal pillar 104 is formed entirely of copper, among other possibilities.

The metal pillar 104 be an annular or rounded metal pillar having a rounded side surface, such as an elliptical side surface or circular side surface. For instance, from a top down view the perimeter of the conductive metal pillar can be substantially circular or substantially elliptical (e.g., may be a cylinder or an ellipsoid).

The metal pillar 104 can have a height extending a distance 122 in range from 40 to 200 nanometers. All individual values and subranges from 40 to 200 nanometers are included; for example, metal pillar 104 can have a height from a lower limit of 40, 45, 50, or 60 nanometers to an upper limit of 200, 150, 120, 100, or 80 nanometers.

The metal pillar 104 can have a width 116 in range from 5 to 100 nanometers. All individual values and subranges from 5 to 100 nanometers are included; for example, metal pillar 104 can have a width from a lower limit of 5, 10, 15, or 20 nanometers to an upper limit of 100, 80, 60, 40, or 25 nanometers.

The metal pillar 104 can include a first distal end 106-1 and a second distal end 106-2. The first distal end 106-1 can be located on an opposite side of the metal pillar relative to the second distal end 106-2. For instance, the first distal end 106-1 can be located at an opposite end of a vertical axis extending vertically between the first distal end 106-1 and the second distal end 106-2, as illustrated in FIG. 1A and FIG. 1B.

In some embodiments, the first distal end 106-1 of the metal pillar 104 can extend a distance 122 above a horizontal axis 120 that is co-planar with the top surface 103-6 of the embedded metal pad 102-5. For instance, in some embodiments, the distance 122 can be in a range from 15 nanometers to 50 nanometers. All individual values and subranges from 15 to 50 nanometers are included; for example, mask material can have a thickness from a lower limit of 15, 20, or 25 nanometers to an upper limit of 50, 40, or 30, nanometers.

The distance 122 can be less than other approaches which do not employ embedded metal pads. Thus, less lateral force (lateral force represented as 130 in FIG. 1A and FIG. 1B) may be applied to a side surface of the contact pillar 102, as compared to other approaches which do not employ embedded metal pads and/or have a larger distance than the distance 122. As such, the embedded metal pads may experience a reduction in an amount of a force translated thereto. Consequently, the underlying materials such as the embedded metal pad may be less prone to exhibiting processing defects such as delamination and/or void formation. For instance, an interface between an embedded metal pad and a dielectric material may be less prone to experiencing delamination and/or void formation.

The distance 122 corresponds to a portion of the metal pillar 104 that is exposed and a distance 109 corresponding to a portion of the metal pillar 104 that is disposed in the mask material can equal a total height (extending the vertical direction 171) of the metal pillar 104. That is a portion of the metal pillar 104 can be disposed in the mask material 102-6. For instance, in some embodiments, 5 percent to 20 percent of the height 121 of the metal pillar 104 is disposed in the substrate and/or the material disposed on the substrate.

Yet, the contact pillars discussed herein have at least a portion of the metal pillar 104 exposed (not disposed in the mask material) to permit the above mentioned enhanced mechanical and/or electrical performance and/or enhanced bond formation, as described herein. For instance, the portion of the height of the metal pillar 104 (e.g., equal to distance 122) that is exposed can be in a range from 10 percent to 85 percent of the height 121 of the metal pillar 104. In some examples, at least 10 percent, at least 20 percent, at least 30 percent, at least 40 percent or at least 50 percent of the height 121 of the metal pillar is exposed (e.g., not disposed in a material such as the mask material 102-6).

For instance, in some embodiments, the distance 109 can be in a range from 5 nanometers to 40 nanometers in the mask material 102-6. All individual values and subranges from 5 to 40 nanometers are included; for example, distance 109 can be in a range having from a lower limit of 5, 6, 7, 8, 9, 10, 11, 12, 13, 14, or 15 nanometers to an upper limit of 40, 30, or 20, nanometers.

In some embodiments, the metal pillar 104 can be formed of a unitary body. For instance, metal pillar 104 can be formed of a conductive material that is deposited into an opening, as described herein, to form a metal pillar having a unitary body. The metal pillar formed of a unitary body can provide enhanced mechanical and/or electrical performance, as compared to other approaches such as those that form a first portion of a metal pillar (e.g., forming a portion of a total height of the metal pillar) and subsequently form a second portion of a metal pillar on the first portion of the metal pillar. For instance, other approaches such as those that having metal pillars formed of a plurality of stacked portions may be prone to voids at an interface between the stacked metal pillars and/or bending unlike the metal pillars herein having a unitary body. For instance, an entire height (e.g., a sum of the distance 122 plus the distance 109) taken in the vertical Z direction 171 of the metal pillar 104 is formed with a continuous and uninterrupted material.

The pillar bump 108 can be formed of solder, as described herein. For instance, the pillar bump 108 can include tin (sg), lead (pb), or a combination thereof. In some embodiments pillar bump can be formed of a solder having a combination of a tin and lead, among other possibilities.

As illustrated in FIG. 1A, the contact pillar 101 can include a barrier material 105 located between and in contact with the metal pillar 104 and the pillar bump 108. For instance, the barrier material 105 can be in contact with a top surface of the metal pillar 104 and a bottom surface of the pillar bump 108. For example, the barrier material 105 can be disposed on the top surface of metal pillar 104 and subsequently the pillar bump 108 can be disposed on a top surface of the barrier material 105. The barrier material 105 can be a metal material such as nickel. The barrier material 105 can mitigate any issues (e.g., corrosion) that may otherwise result from having the metal pillar 104 directly contact the pillar bump 108.

However, in some embodiments the contact pillar 101 can be formed with an absence of a barrier material 105. FIG. 1B illustrates a view of a cross-section of another example of a semiconductor device 100 with an embedded metal pad in accordance with a number of embodiments of the disclosure.

The semiconductor device 100 illustrated in FIG. 1B is analogous to the semiconductor device 100 illustrated in FIG. 1A, but has an absence of a barrier material at an interface between the metal pillar 104 and the pillar bump 108. As illustrated in FIG. 1B, the contact pillar 101 can have an absence of barrier material at an interface between the metal pillar 104 and the pillar bump 108. The absence of a barrier material can ease fabrication, reduce cost, and/or can yield an contact pillar with a given dimension (e.g., a contact pillar with a shorter overall height), etc.

Figure 2:
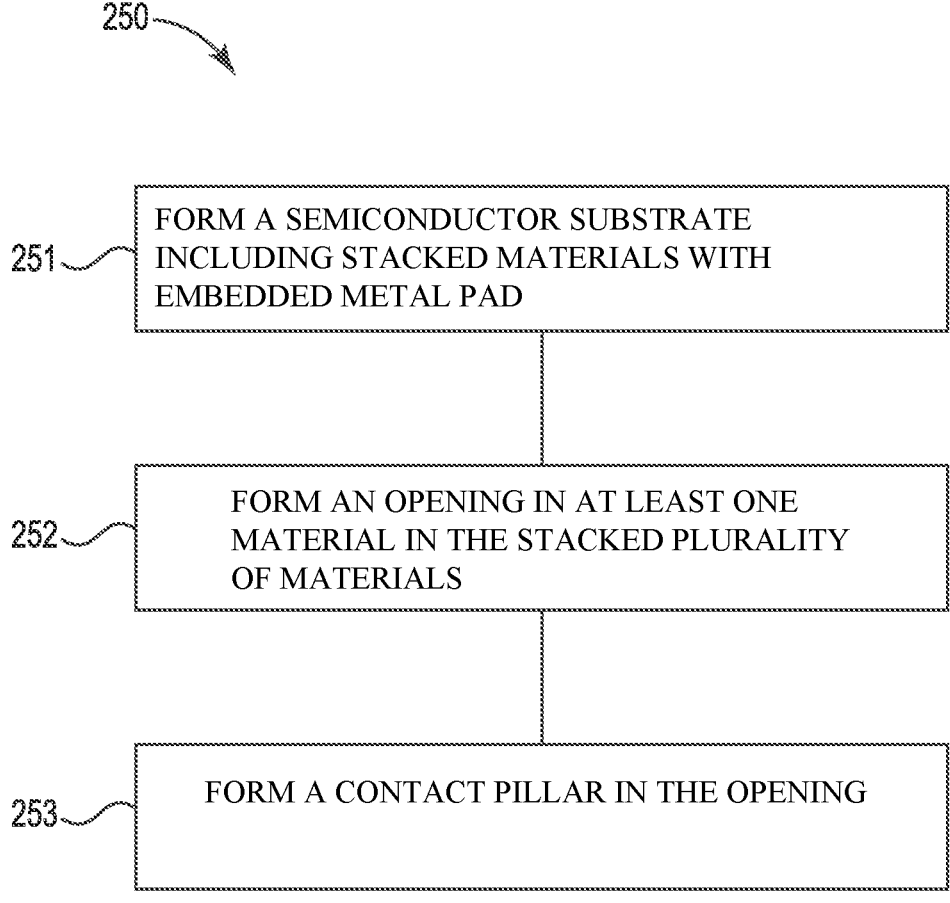
FIG. 2 illustrates a flow diagram for an example of a method of formation of a semiconductor device with an embedded metal pad in accordance with a number of embodiments of the disclosure.
Figure 3:
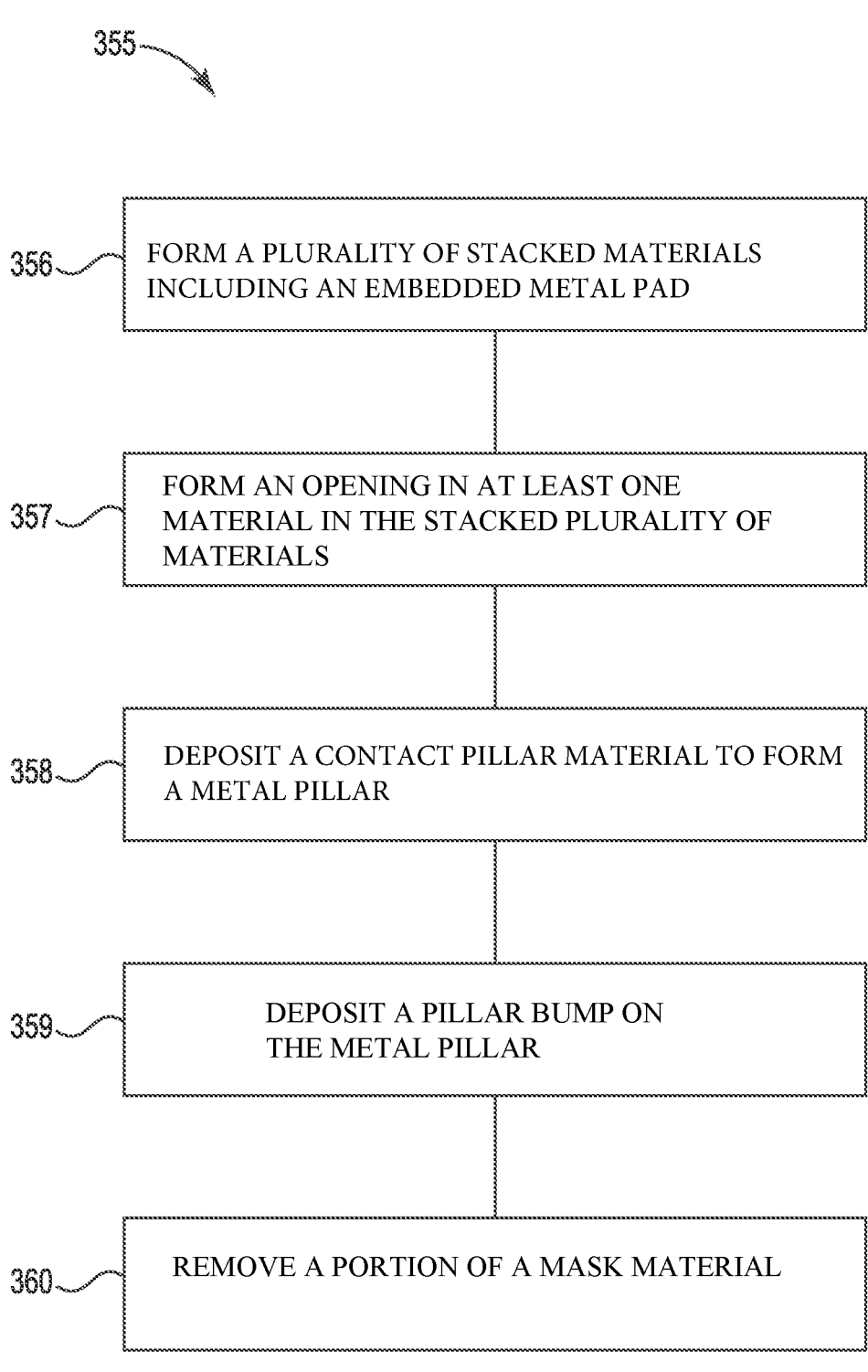
FIG. 3 illustrates a flow diagram for an example of method of formation of a system with an embedded metal pad in accordance with a number of embodiments of the disclosure.

FIG. 2 illustrates a flow diagram for an example of a method 250 of formation of a semiconductor device with an embedded metal pad in accordance with a number of embodiments of the disclosure. FIG. 3 illustrates a flow diagram for an example of method 355 of formation of a system with an embedded metal pad in accordance with a number of embodiments of the disclosure.

Although the methods 250, 355 are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 251, a semiconductor substrate including a plurality of stacked materials can be formed. For instance, a semiconductor substrate can be formed and can include various materials formed on and/or in the semiconductor substrate. For instance, various materials such as a dielectric material, an embedded metal pad, and a mask material, etc. can be deposited on and/or can be included in the semiconductor substrate, as described herein. Notably, the embedded metal pad can be deposited in a recess, as detailed herein, to embed the lower portion of the metal pad in the dielectric material.

At 252, an opening can be formed in at least one material of the plurality of stacked materials. The opening can be formed in the semiconductor substrate and/or in at least one material disposed on the semiconductor substrate. For instance, an opening can be formed in a portion of a mask material, as described herein.

Various etching and masking processes may be utilized to form the opening and/or the above mentioned recess. Etching is a process to remove (e.g., chemically) different materials selectively and/or non-selectively from among different portions of semiconductor devices during the fabrication process. Two types of etchants are liquid-phase (wet) and plasma-phase (dry).

In some examples, a wet etch can be performed to form the opening. Wet etching uses liquid etchants. During a wet etch, a portion of or all of a semiconductor device can be immersed in a bath of the etchant, which can be agitated to achieve good process control. As an example, buffered hydrofluoric acid (BHF) can be used to etch silicon dioxide. As an alternative to immersion, certain semiconductor device fabrication tools and equipment (e.g., a semiconductor device processing chamber) may employ a gas to cushion and protect one side of the wafer while an etchant is applied to the other side.

The opening can provide a contact pillar deposition space. For example, the opening can be configured to receive contact pillar material (e.g., copper) that forms a metal pillar of a contact pillar, as described herein. For instance, the opening can be configured to have a height that is equal to greater than a height (e.g., a final height) of a metal contact.

At 253, a contact pillar can be formed. For instance, a contact pillar material can be deposited in the contact pillar deposition space to form a metal pillar. The metal pillar can form a portion of the contact pillar. The contact pillar material can be a conductive material. Embodiments provide that the conductive material can be a metal. The conductive material can be as discussed herein. One or more embodiments provide that the conductive material comprises copper. Stated differently, in some embodiments the contact pillar material can be copper and the resultant metal pillar can be a copper contact pillar.

In some embodiments, the contact pillar material can be deposited at an initial height and can be planarized to form a final height of the metal pillar. For instance, chemical-mechanical planarization can be performed to remove a portion of the deposited contact pillar material and thereby form the metal pillar at a final height, among other possibilities. However, in some embodiments the contact pillar material can be deposited in the opening to final height of the metal pillar.

In some embodiments, a portion of the deposited mask material can be removed. For instance, a portion of a height of the mask material can be removed such that a remaining portion of the mask material has a height of at least 10 nanometers. Having the height of mask material be at least 10 nanometers can promote aspects herein. For instance, the second distal end of the metal pillar can be embedded a distance that is at least 5 nanometers into the mask material. The second distal end of the metal pillar can be in direct contact (e.g., direct physical contact) with all or a portion of a surface (e.g., a top surface) of the embedded metal pad.

Moreover, one or more underlying materials at least due to the embedded metal pad being embedded at least 5 nanometers may experience a reduction in an amount of lateral force that is translated thereto and/or provide enhanced structural rigidity to resist a force imparted on the embedded metal pad, and consequently approaches herein may be less prone to processing defects such as delamination and/or void formation. For instance, an interface between the embedded metal pad and the dielectric material may be less prone to experiencing delamination and/or void formation.

A pillar bump can be deposited on the metal pillar to form the contact pillar. The pillar bumps (e.g., bumps of solder) can be applied with a ball drop operation and/or can be applied via electroplating, among other possibilities. A solder paste can be deposited to form the pillar bump, among other possibilities.

In some embodiments, a pillar bump can be deposited on the first distal end of the metal pillar to form a contact pillar. However, in some embodiments a barrier layer (e.g., barrier material 105 as illustrated in FIG. 1A) can be deposited on a top surface of the metal pillar. The barrier layer can be formed of a metal material. In such embodiments, the pillar bump can be deposited on a top surface of the barrier layer to form the contact pillar.

The pillar bump can be formed of solder. The solder can include tin (sg), lead (pb), or a combination thereof. In some embodiments the solder can include tin and lead. The solder bump can be formed by heating solder to a temperature that permits the solder to flow and be disposed as solder bumps, among other possibilities. In various embodiments, each metal contact pillar can have respective solder bump (e.g., disposed on a respective first end thereof).

As mentioned, FIG. 3 illustrates a flow diagram for an example of the method 355 of formation of a system with an embedded metal pad. At 356, a plurality of stacked materials can be formed. The stacked materials can include a dielectric material (e.g., low-k dielectric material, a dielectric material, etc.), an embedded metal pad, and a mask material, among other possible materials. For instance, the embedded metal pad can be disposed on a first portion of a surface of the dielectric materials and the mask materials can be disposed on at least a second portion of the surface of the dielectric material, as described herein.

In some embodiments, a dielectric material can be disposed on a top surface of a low-k dielectric material. In such embodiments, a conductive material can be disposed in or on the dielectric material. Additional dielectric material can be disposed on a surface (e.g., a top surface) of conductive material. An embedded metal pad can be disposed on a first portion of a surface of the dielectric material.

As mentioned, the stacked materials can be formed on (e.g., on an exterior surface such as a top surface) or in a substrate (e.g., on in interior surface located in a trench extending a distance into substrate). For instance, in some embodiments the plurality of stacked materials can be formed on substrate. For example, a substrate such as polysilicon substrate can be formed. The dielectric material can be deposited on a surface (e.g., a top surface) of the dielectric material. Subsequently, the embedded metal pad can be deposited on the first portion of the surface of the dielectric material. Then the mask material can be deposited on a surface (e.g., a top surface) of the embedded metal pad and on a second portion of the top surface of the dielectric material. The mask material can be deposited to a uniform thickness. As mentioned, a recess can be formed in a portion of a top surface of a dielectric material to permit formation of the embedded metal pad in the recess and thereby embed a lower portion of a side surface of the embedded metal pad in the dielectric material.

At 357, an opening can be formed in at least one of the plurality of stacked materials. For instance, an opening can be formed through a portion of the thickness of the mask material that overlays at least a portion of the embedded metal pad. For instance, an entirety of the thickness that overlay some or all of the embedded metal pad can be removed so that the metal pillar, once formed, is in direct contact with at least a portion of a top surface of the embedded metal pad. As mentioned, the opening can be formed with a wet etchant, among other possibilities.

At 358, a contact pillar material can be deposited. As described herein, the contact pillar material can form the metal pillar. For instance, copper can be deposited to form the metal pillar, among other possibilities. In some embodiments, a contact pillar material can be deposited in the opening to form a metal pillar in contact on at least the surface of the embedded metal pad. For instance, the metal pillar can contact a surface of the embedded metal pad and a mask material, as described herein.

At 359, a pillar bump can be deposited. For instance, a pillar bump formed of solder can be deposited on a top surface of a metal pillar.

At 360, a portion of a mask material can be removed prior to or subsequent to deposition of the pillar bump. For instance, a wet etch can be used to remove the portion of the mask material, as described herein. For example, a portion of but not of a height of the mask material can be removed to expose a portion of a contact pillar, as described herein. For instance, a portion of the mask material can be removed with an etchant such as wet etchant such that a remaining portion of the mask material has a thickness that is at least 10 nanometers to embed a portion of the top surface of the embedded metal pad at least 5 nanometers in the mask material.

Figure 4:
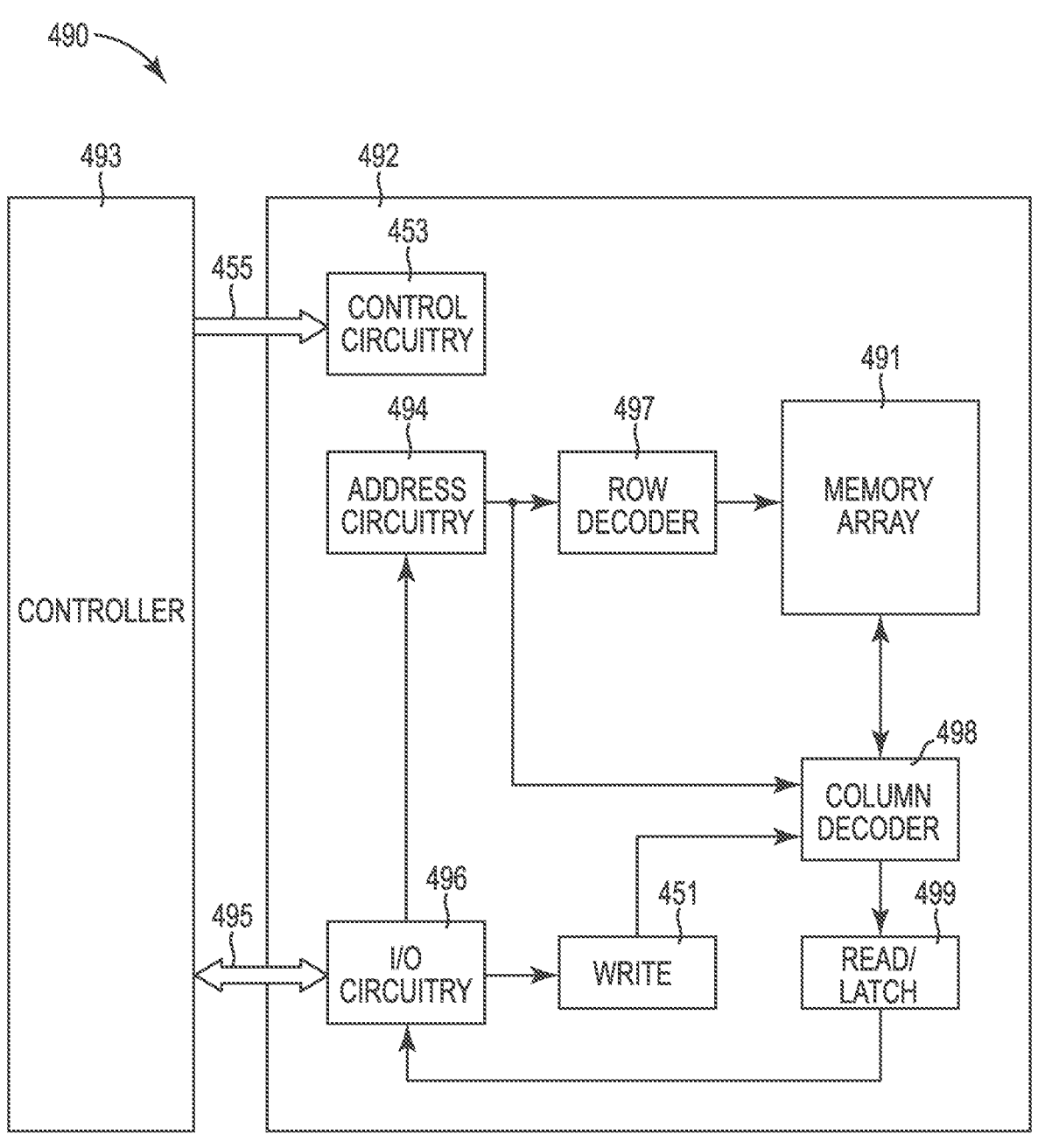
FIG. 4 is a block diagram illustration of an example apparatus, such as an electronic memory system, in accordance with an embodiment of the disclosure.

FIG. 4 is a block diagram illustration of an example apparatus, such as an electronic memory system 490, in accordance with an embodiment of the present disclosure. Memory system 490 may include an apparatus, such as a memory device 492 and a controller 493, such as a memory controller (e.g., a host controller). Controller 493 might include a processor, for example. Controller 493 might be coupled to a host, for example, and may receive command signals (or commands), address signals (or addresses), and data signals (or data) from the host and may output data to the host. Controller 493 can perform one or more operations for storing a data value by programming a memory cell in accordance with the present disclosure.

Memory device 492 includes a memory array 491 of memory cells. For example, memory array 491 may include one or more of the memory arrays, such as a vertical stacked array as discussed herein. Memory device 492 may include address circuitry 494 to latch address signals provided over I/O connections 495 through I/O circuitry 496. Address signals may be received and decoded by a row decoder 497 and a column decoder 498 to access the memory array 491. Memory device 492 and/or memory array 491 can include a semiconductor device with an embedded metal pads, as discussed herein. For instance, the memory array 491 can include one or more semiconductor device with an embedded metal pad.

Memory device 492 may sense (e.g., read) data in memory array 491 by sensing voltage and/or current changes in the memory array columns using sense/buffer circuitry that in some examples may be read/latch circuitry 499. Read/latch circuitry 499 may read and latch data from the memory array 491. Sensing circuitry (not shown) may include a number of sense amplifiers coupled, for instance via conductive structures such as the access lines described herein to memory cells of memory array 491, which may operate in combination with the read/latch circuitry 499 to sense (e.g., read) memory states from targeted memory cells. I/O circuitry 496 may be included for bi-directional data communication over the I/O connections 495 with controller 493. Write circuitry 451 may be included to write data to memory array 491.

Control circuitry 453 may decode signals provided by control connections 455 from controller 493. These signals may include chip signals, write enable signals, and address latch signals that are used to control the operations on memory array 491, including data read and data write operations.

Control circuitry 453 may be included in controller 493, for example. Controller 493 may include other circuitry, firmware, software, or the like, whether alone or in combination. Controller 493 may be an external controller (e.g., in a separate die from the memory array 491, whether wholly or in part) or an internal controller (e.g., included in a same die as the memory array 491). For example, an internal controller might be a state machine or a memory sequencer.

FIG. 5A-5F illustrate views of a portion of an example semiconductor structure including an embedded metal pad at a particular stages in an example semiconductor structure fabrication sequence in accordance with a number of embodiments of the present disclosure.

Figure 5A:
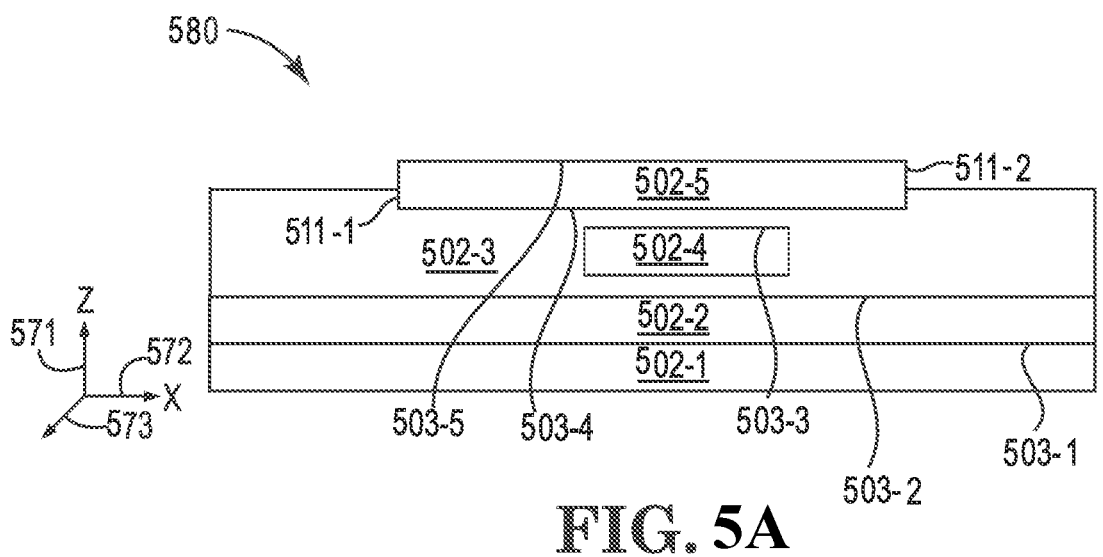
FIG. 5A-5E illustrate views of a portion of an example semiconductor structure including an embedded metal pad at a particular stages in an example semiconductor structure fabrication sequence in accordance with a number of embodiments of the present disclosure.

As illustrated in FIG. 5A, a semiconductor substrate 502-1 including a plurality of stacked materials is present. For instance, a semiconductor substrate 502-1 can be formed and can include various materials formed on and/or in the semiconductor substrate 502-1. For instance, a low-k dielectric material 502-2 can be present on a top surface 503-1 of the semiconductor substrate 502-1. A dielectric material 502-3 can be present on a top surface 503-2 of the low-k dielectric material 502-2. A conductive material 502-4 can be disposed in the dielectric material, as described herein. For instance, the dielectric material 502-3 can be disposed on surfaces of the conductive material 502-4 such as a top surface 503-3 of the conductive material.

Notably, a metal pad material (e.g., aluminum) can be deposited or otherwise formed in a recess in the dielectric material 502-3. The instance, the metal pad material can be formed on a portion of a top surface 503-4 of the dielectric material 502-3 that is recessed a distance relative to a different portion of the top surface 503-4. In some embodiments, the metal pad material can be deposited in the recessed portion and the different portion (e.g., adjacent the recess) of the top surface 503-4 can be removed with an etchant or otherwise such that a portion of the resultant embedded metal pad 502-5 extends a distance above the top surface of the dielectric material 502-3 that is adjacent to the recess, as illustrated in FIG. 5A.

Accordingly, as illustrated in FIG. 5A, a lower portion 511-1 of an embedded metal pad 502-5 can be embedded in the dielectric material 502-3. Yet, an upper portion 511-2 of the embedded metal pad 502-5 can remain exposed (e.g., is not embedded in a material) at this stage, as illustrated in FIG. 5A. That is, some but not all of a side surface of the embedded metal pad 502-5 is embedded in the dielectric material 502-3.

Having some but not all of the side surface of the embedded metal pad 502-5 be embedded in the dielectric material 502-3 can provide various mechanical and/or electrical performance attributes and/or yield relatively small semiconductor structures (e.g., in a 571 direction which is perpendicular or normal to a first horizontal ("X") direction 572 and a second horizontal ("Y") direction 573 plane). Yet, as mentioned, an interface between the embedded metal pad 502-5 and the dielectric material may be less prone to experiencing delamination and/or void formation due at least in part to having a lower portion 511-1 of the side surface of the embedded metal pad 502-5 be embedded in the dielectric material 502-3, as detailed herein.

Figure 5B:
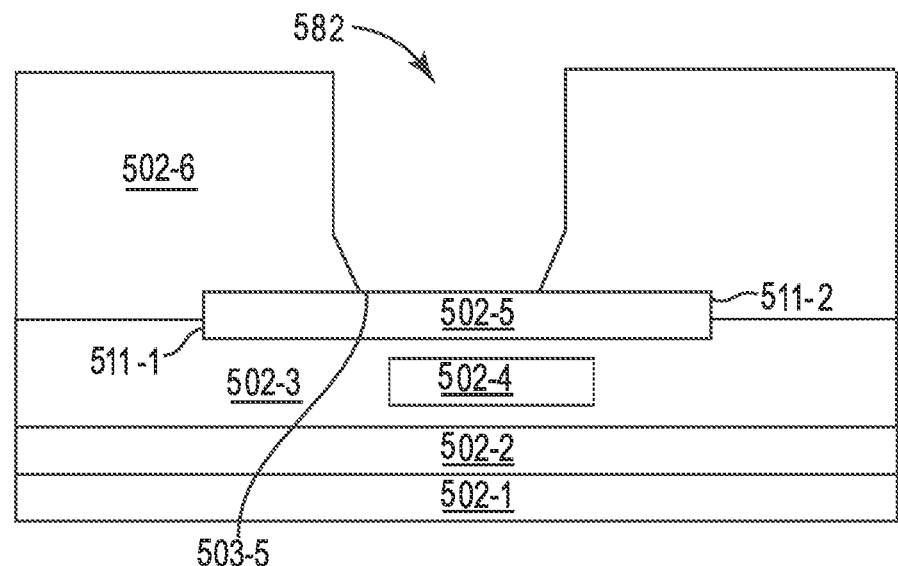

A mask material 502-6 can be disposed on a portion of a surface 503-5 of the dielectric material 502-3, an upper portion 511-2 of the side surface of the embedded metal pad 502-5, and a portion of a top surface 503-5 of the embedded metal pad 502-5. As illustrated in FIG. 5B, an opening 582 can be formed in the mask material 502-6. The opening 582 can provide a deposition space for the contact pillar, as described herein.

Figure 5C:
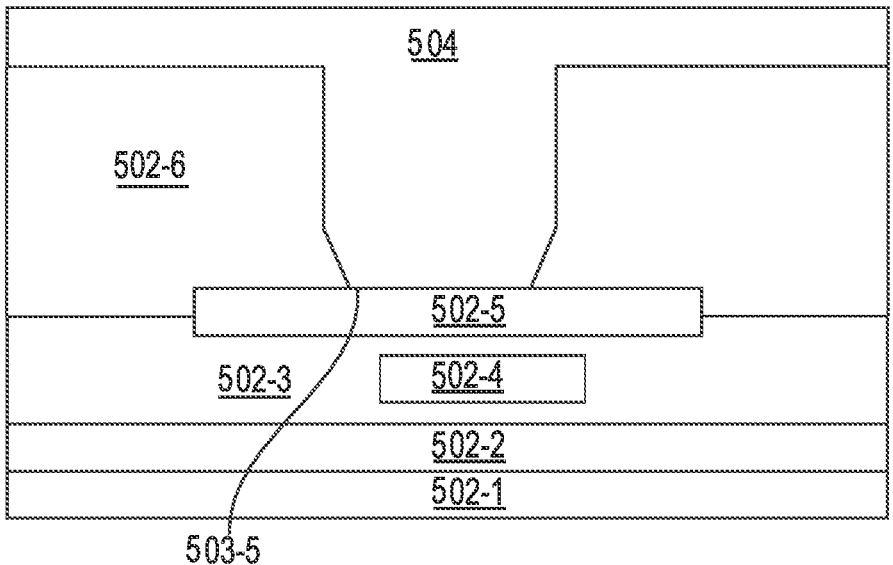
Figure 5D:
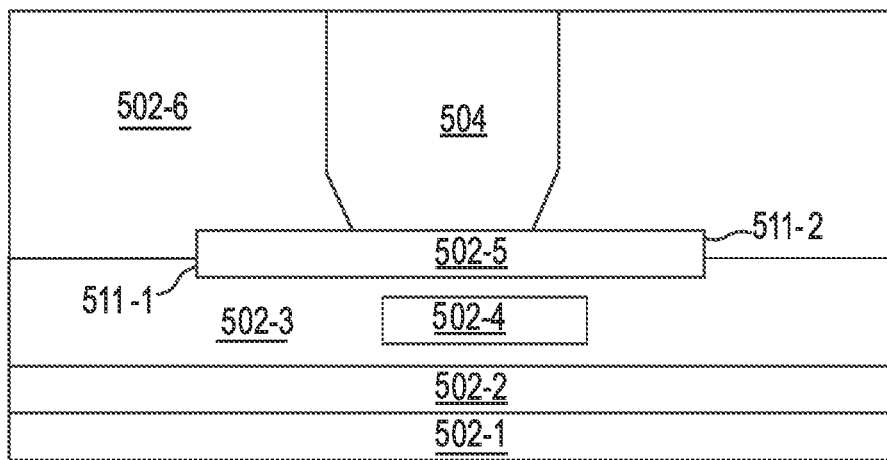
Figure 5E:
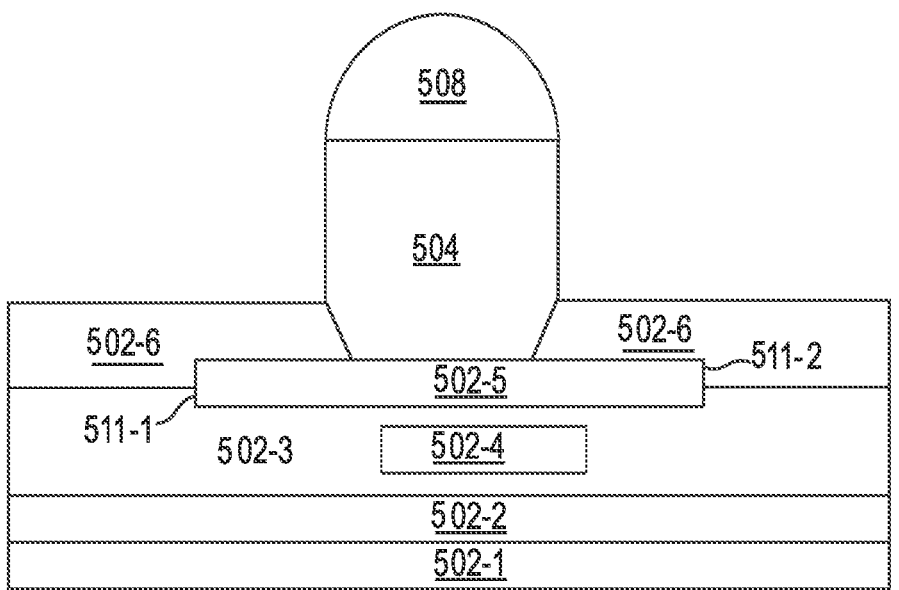

As illustrated, in FIG. 5C the contact pillar material 104 can be disposed in the opening and on a top surface of the mask material 502-6. As illustrated in FIG. 5D, the a portion of the contact pillar material 104 can be remove or planarized to form the contact pillar 104, as described herein. As illustrated in FIG. 5E, a portion of the mask material 502-6 can be removed and a pillar bump can be formed on the contact pillar, as described herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the disclosure includes other applications in which the above structures and methods are used. Therefore, the scope of a number of embodiments of the disclosure should be determined with reference to the appended claims, along with the full range of equivalents to which such claims are entitled.

While examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor device have been illustrated and described herein, examples of the disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor device than those disclosed herein are expressly included within the scope of this disclosure.

What is claimed is:

1. A semiconductor device, comprising:
   a dielectric material;
   an embedded metal pad having a plurality of side surfaces, wherein lower portions of the plurality of side surfaces are embedded in the dielectric material such that the dielectric material is in continuous contact with the lower portions of the plurality of side surfaces of the embedded metal pad and a bottom surface of the embedded metal pad such that there are no intervening materials in contact with the lower portions of the plurality of side surfaces of the embedded metal pad and the bottom surface of the embedded metal pad;
   a mask material on a portion of a surface of the dielectric material, upper portions of the side surfaces of the embedded metal pad, and a portion of a top surface of the embedded metal pad, wherein a width of the bottom surface of the embedded metal pad in the dielectric material is a same width as a width of the top surface of the embedded metal pad in the mask material; and
   a contact pillar on a second portion of the top surface of the embedded metal pad, the contact pillar comprising a metal pillar and a pillar bump.

2. The semiconductor device of claim 1, wherein the lower portions of the plurality of side surfaces embedded in the dielectric material each have a height that is at least 5 percent of a total height of each side surface of the plurality of side surfaces.

3. The semiconductor device of claim 1, wherein the lower portions of the plurality of side surfaces embedded in the dielectric material each have a height that is in a range from 5 percent to 90 percent of a total height of each side surface of the plurality of side surfaces.

4. The semiconductor device of claim 1, wherein the portion of the top surface of the embedded metal pad is embedded a distance in a range from 5 nanometers to 40 nanometers in the mask material.

5. The semiconductor device of claim 1, wherein an entirety of the metal pillar is a formed of a unitary body.

6. The semiconductor device of claim 1, wherein the pillar bump is formed of tin (sg), lead (pb), or a combination thereof, and wherein the metal pillar is a copper pillar.

7. The semiconductor device of claim 1, wherein a thickness of the mask material is in a range from 10 nanometers to 60 nanometers.

8. The semiconductor device of claim 1, wherein the mask material is a polyamide.

9. A system comprising:
   a substrate including stacked materials, the stacked materials including:
      a low-k dielectric material;
      a dielectric material on a surface of the low-k dielectric material;
      a conductive material disposed in the dielectric material;
      an embedded metal pad having a plurality of side surfaces, wherein lower portions of the plurality of side surfaces are embedded in the dielectric material such that the dielectric material is in continuous contact with the lower portions of the plurality of the side surfaces of the embedded metal pad and a bottom surface of the embedded metal pad such that there are no intervening materials in contact with the lower portions of the plurality of side surfaces of the embedded metal pad and the bottom surface of the embedded metal pad;

a mask material on a portion of a surface of the dielectric material, upper portions of the plurality of the side surfaces of the embedded metal pad, and a portion of a top surface of the embedded metal pad, wherein a width of the bottom surface of the embedded metal pad in the dielectric material is a same width as a width of the top surface of the embedded metal pad in the mask material; and a contact pillar on a second portion of the top surface of the embedded metal pad, the contact pillar comprising:

a metal pillar with a first distal end and a second distal end; and a pillar bump formed on the first distal end of the metal pillar.

10. The system of claim 9, wherein the first distal end of the metal pillar extends a distance above an axis that is co-planar with a top surface of the mask material.

11. The system of claim 10, wherein the embedded metal pad is formed of aluminum.

12. The system of claim 9, wherein the contact pillar has a height in a range from 40 to 200 nanometers.

13. The system of claim 9, wherein 5 percent to 20 percent of a height of the contact pillar is embedded.

14. The system of claim 9, wherein a portion of a height of the metal pillar is exposed from the mask material.

15. The system of claim 14, wherein the portion of the height of the metal pillar that is exposed from the mask material is in a range from 10 percent to 85 percent of the height of the metal pillar.

16. The system of claim 9, wherein the mask material is a top material in a plurality of stacked materials including the low-k dielectric material, the dielectric material, the conductive material, and the embedded metal pad.

17. A method of forming an embedded metal pad, the method comprising:

forming a plurality of stacked materials including:

16 a dielectric material;

the embedded metal pad having a plurality of side surfaces, wherein lower portions of the plurality of side surfaces are embedded in the dielectric material such that the dielectric material is in continuous contact with the lower portions of the plurality of side surfaces of the embedded metal pad and a bottom surface of the metal pad such that there are no intervening materials in contact with the lower portions of the plurality of side surfaces of the embedded metal pad and the bottom surface of the embedded metal pad; and a mask material on a portion of a surface of the dielectric material, upper portions of the plurality of side surfaces of the embedded metal pad, and a portion of a top surface of the embedded metal pad, wherein a width of the bottom surface of the embedded metal pad in the dielectric material is a same width as a width of the top surface of the embedded metal pad in the mask material;

forming an opening in a portion of the mask material to expose at least a portion of the top surface of the embedded metal pad;

depositing a contact pillar material in the opening to form a metal pillar in direct contact with at least the portion of the top surface of the embedded metal pad, wherein the metal pillar includes a first distal end and a second distal end;

depositing a pillar bump on the first distal end of the metal pillar; and removing a portion of the mask material with an etchant.

18. The method of claim 17, further comprising removing the portion of the mask material with a wet etchant.

19. The method of claim 17, wherein forming the plurality of stacked materials further comprises forming a recess in a top surface of the dielectric material.

20. The method of claim 19, further comprising forming the embedded metal pad in the recess.

* * * * *